(12) United States Patent
Usami et al.

(10) Patent No.: US 7,745,937 B2
(45) Date of Patent: Jun. 29, 2010

(54) SEMICONDUCTOR DEVICE AND METHOD OF MANUFACTURING THE SAME (75) Inventors: Tatsuya Usami, Kawasaki (JP); Koichi Ohto, Kawasaki (JP); Toshiyuki Takewaki, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 711 days.

(21) Appl. No.: 11/355,003

(22) Filed: Feb. 16, 2006

(65) Prior Publication Data

US 2006/0186549 A1 Aug. 24, 2006

(30) Foreign Application Priority Data

Feb. 24, 2005 (JP) ............... 2005-049502

(51) Int. Cl.
*H01L 23/48* (2006.01)
(52) U.S. Cl. ............... 257/762; 257/774; 257/E23.145; 438/684
(58) Field of Classification Search .......... 257/762, 257/774, E23.145
See application file for complete search history.

(56) References Cited

U.S. PATENT DOCUMENTS

| | | | |
|---|---|---|---|
| 6,150,270 A | 11/2000 | Matsuda et al. | |
| 6,599,827 B1 | 7/2003 | Ngo et al. | |
| 6,762,500 B2 * | 7/2004 | Ahn et al. | 257/760 |
| 7,187,081 B2 * | 3/2007 | Huang et al. | 257/759 |
| 2002/0155702 A1 * | 10/2002 | Aoki et al. | 438/653 |
| 2004/0046261 A1 * | 3/2004 | Ohto et al. | 257/774 |
| 2004/0188809 A1 * | 9/2004 | Ogihara et al. | 257/642 |

FOREIGN PATENT DOCUMENTS

| | | |
|---|---|---|
| CN | 1372313 | 10/2002 |
| CN | 1552096 A | 12/2004 |
| JP | 10-189604 | 7/1998 |
| JP | 11-204523 | 7/1999 |
| JP | 2001-053076 | 2/2001 |
| JP | 2002-246391 | 8/2002 |
| JP | 2004-096052 | 3/2004 |
| JP | 2004-193544 | 7/2004 |
| JP | 2004-296515 | 10/2004 |

OTHER PUBLICATIONS

Laurent G. Gosset et al., "Integration and characterization of a self-aligned barrier to Cu diffusion based on copper silicide", 2003 Advanced Metallization Conference Proceedings, USA, Materials Research Society, Oct. 21, 2003, p. 321-328.

(Continued)

*Primary Examiner*—Sue Purvis
*Assistant Examiner*—Krista Soderholm
(74) *Attorney, Agent, or Firm*—Young & Thompson (57) ABSTRACT

A first gas including a silicon-containing compound is introduced into a vacuum chamber, to expose a semiconductor substrate placed in the chamber to the first gas atmosphere (silicon processing step). Then the pressure inside the vacuum chamber is reduced to a level lower than the pressure at the time of starting the silicon processing step (depressurizing step). Thereafter, a second gas including a nitrogen-containing compound is introduced into the vacuum chamber, and the semiconductor substrate is irradiated with the second gas plasma (nitrogen plasma step).

15 Claims, 12 Drawing Sheets

OTHER PUBLICATIONS

L. G. Gosset et al., "Integration and performances of an alternative approach using copper silicide as a self-aligned barrier for 45 nm technology node Cu interconnects", 2004 International Interconnect Technology Conference Proceedings, USA, IEEE, Jun. 2004.

Chinese Patent Office issued a Chinese Office Action dated Oct. 16, 2009, Application No. 20061009472.9.
Japanese Patent Office issued a Japanese Office Action dated Feb. 16, 2010, Application No. 2005-049502.

* cited by examiner

SEMICONDUCTOR DEVICE AND METHOD OF MANUFACTURING THE SAME

This application is based on Japanese patent application No. 2005-049502, the content of which is incorporated hereinto by reference.

BACKGROUND

1. Technical Field

The present invention relates to a semiconductor device, and to a method of manufacturing the same.

2. Related Art

The ongoing reduction in spacing width between interconnects in semiconductor devices has originated various issues that lead to degradation in reliability of the semiconductor devices. One of such issues is Time Dependent Dielectric Breakdown (hereinafter, TDDB). The TDDB resistance between the interconnects is degraded as the spacing between the interconnects becomes narrower. In other words, the narrower the spacing between the interconnects is, the less resistant the resist employed in the formation of the interconnects becomes against the etching process. This makes the formation process more difficult, leading to an increase in line edge roughness (LER) of the interconnects, which often provokes the TDDB.

The TDDB resistance can be enhanced by an ammonia plasma process, i.e. irradiating a semiconductor substrate having the interconnects exposed on its surface with an ammonia plasma. In this process, however, a stress induced void (hereinafter, SIV) is prone to take place when the semiconductor device includes copper interconnects. The SIV is another factor that leads to the degradation in reliability of the semiconductor devices.

To cope with such problems, Japanese Laid-open patent publications No. H10-189604, No. H11-204523 and No. 2004-193544 propose performing the ammonia plasma process on a semiconductor substrate having a copper interconnect exposed on its surface, after a silane process of exposing the semiconductor substrate in silane atmosphere. A method of performing the both before and after the silane process is disclosed in the documents: Laurent G. Gosset et al., "Integration and characterization of a self-aligned barrier to Cu diffusion based on copper silicide", 2003 Advanced Metallization Conference Proceedings, USA, Materials Research Society, Oct. 21, 2003, p. 321-328; and L. G. Gosset et al., "Integration and performances of an alternative approach using copper silicide as a self-aligned barrier for 45 nm technology node Cu interconnects", 2004 International Interconnect Technology Conference Proceedings, USA, IEEE, June 2004. In addition, U.S. Pat. No. 6,599,827 proposes executing the ammonia plasma process only before the silane process.

SUMMARY OF THE INVENTION

Performing the ammonia plasma process after the silane process provides a semiconductor device that effectively prevents both the TDDB and the SIV. On the other hand, the silane remains on the surface of the semiconductor substrate in a form of a silicon deposit through a reaction during the ammonia plasma process, thereby increasing the leak current between the interconnects. The leak current also incurs the degradation in reliability of the semiconductor device.

According to the present invention, there is provided a method of manufacturing a semiconductor device, comprising placing a semiconductor substrate with a conductive layer composed essentially of a copper-containing metal exposed on a surface of the semiconductor substrate in a vacuum chamber (preparation step); introducing a first gas composed essentially of a silicon-containing compound into the vacuum chamber, so as to expose the semiconductor substrate in the first gas atmosphere (silicon processing step); reducing, after the introducing of the first gas, a pressure in the vacuum chamber to a second pressure lower than a first pressure in the vacuum chamber set at the time of starting the introducing of the first gas (depressurizing step); and introducing a second gas composed essentially of a nitrogen-containing compound into the vacuum chamber after the reducing of the pressure in the vacuum chamber, so as to irradiate the semiconductor substrate with a plasma of the second gas (nitrogen plasma step).

The method of manufacturing thus arranged includes the depressurizing step between the silicon processing step and the nitrogen plasma step. In the depressurizing step, the pressure in the vacuum chamber is reduced to a level lower than the pressure set at the time of starting the silicon processing step. This serves to reduce the amount of the silicon deposit that may remain on the semiconductor substrate surface where the conductive layer is provided, created during the nitrogen plasma step after the depressurizing step. Accordingly, such manufacturing method provides a semiconductor device that effectively restricts emergence of the leak current between the interconnects. Also, since the method includes the silicon processing step and the nitrogen plasma step to be thereafter performed, the semiconductor device thereby produced obtains excellent TDDB resistance and SIV resistance.

According to the present invention, there is provided a semiconductor device comprising a semiconductor substrate; an insulating layer provided on the semiconductor substrate; a conductive layer composed essentially of a copper-containing metal, filled in a recessed portion provided in the insulating layer; an alloy layer containing copper and silicon, formed in a surface layer of the conductive layer; and a nitride layer formed by nitriding the insulating layer, in a uniform thickness in a surface layer of the insulating layer.

The semiconductor device thus configured acquires high TDDB resistance, since the nitride layer is formed in the surface layer of the insulating layer. Also, because of the presence of the alloy layer containing copper and silicon in the surface layer of the conductive layer, the semiconductor device has excellent SIV resistance as well. Further, since the nitride layer is formed in a uniform thickness, the semiconductor device effectively restricts the leak current between the interconnects.

The present invention thus provides a highly reliable semiconductor device, and a method of manufacturing the same.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a semiconductor device and a method of manufacturing the same according to the present invention will be described in details, referring to the accompanying drawings. In the drawings, same constituents are given the same numerals, and description thereof will be omitted where appropriate.

First Embodiment

Figure 1:
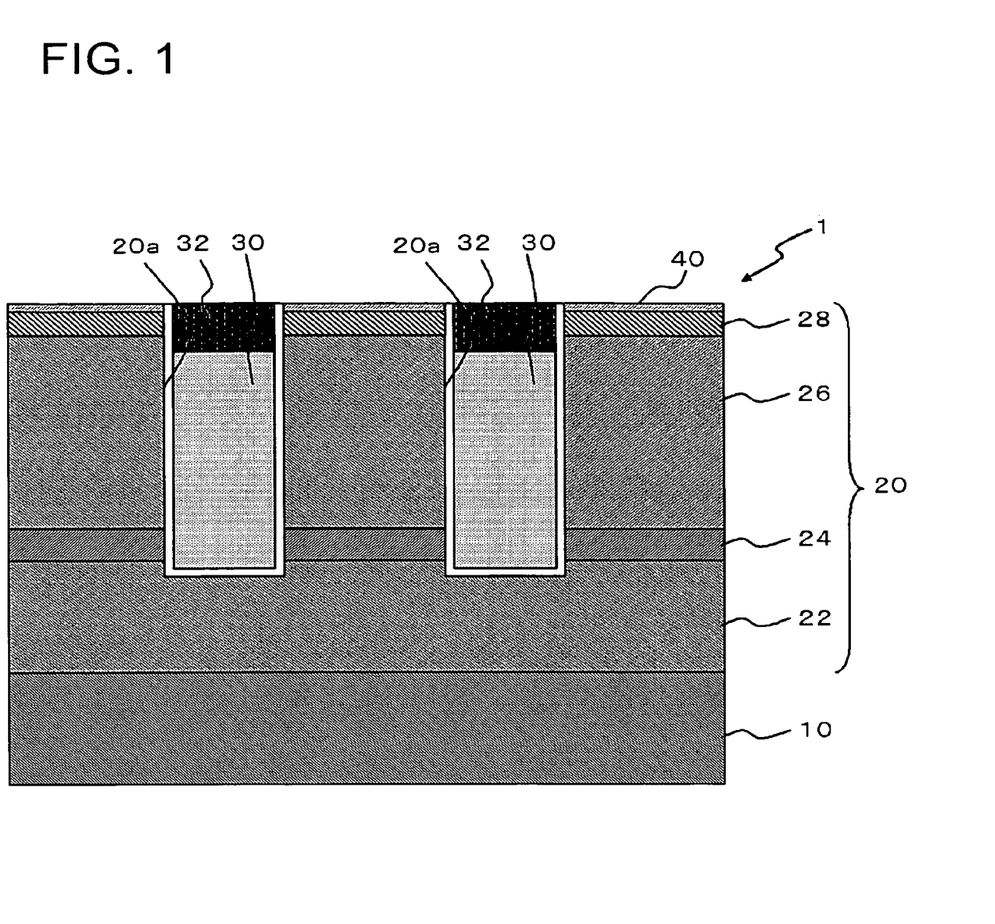
FIG. 1 is a schematic cross-sectional view showing a semiconductor device according to the first embodiment of the present invention.

FIG. 1 is a schematic cross-sectional view showing a semiconductor device according to the first embodiment of the present invention. The semiconductor device 1 includes a semiconductor substrate 10, an insulating layer 20, a conductive layer 30, an alloy layer 32, and a nitride layer 40. On the semiconductor substrate 10, circuit chips such as a transistor (not shown) are provided.

On the semiconductor substrate 10, the insulating layer 20 is provided. The insulating layer 20 includes insulating layers 22, 24, 26, 28, sequentially stacked on the semiconductor substrate 10. Out of these, the insulating layers 24, 28 serve as an etching stopper and a protection layer against CMP, respectively. In this embodiment in particular, the insulating layers 22, 26 are constituted of a porous film.

The insulating layer 20 includes a recessed portion 20a. The recessed portion 20a penetrates through the insulating layers 28, 26, 24 so as to reach the insulating layer 22. The recessed portion 20a is filled with the conductive layer 30 composed of a copper-containing metal. The conductive layer 30 may be made of copper, or an alloy containing copper. Examples of the latter include a copper-aluminum alloy. The conductive layer 30 serves as an interconnect in the semiconductor device 1.

In the surface layer of the conductive layer 30, the alloy layer 32 is provided. The alloy layer 32 contains copper and silicon. In the surface layer of the insulating layer 28 (the surface layer of the insulating layer 20), the nitride layer 40 is provided. The nitride layer 40 is formed by nitriding the insulating layer 28. As such, nitrogen is unevenly distributed in the surface layer of the insulating layer 28, thus constituting the nitride layer 40. The nitride layer 40 is formed in a uniform thickness in the surface layer of the insulating layer 28.

Figure 2:
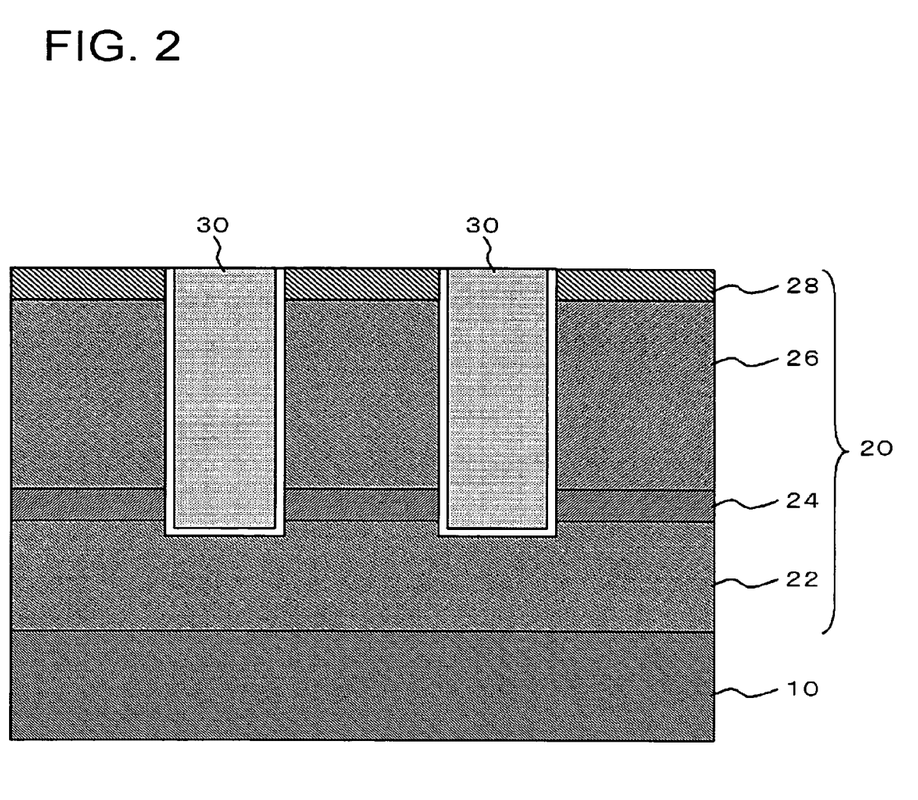
FIG. 2 is a schematic cross-sectional view for explaining the method of manufacturing the semiconductor device of FIG. 1.
Figure 3:
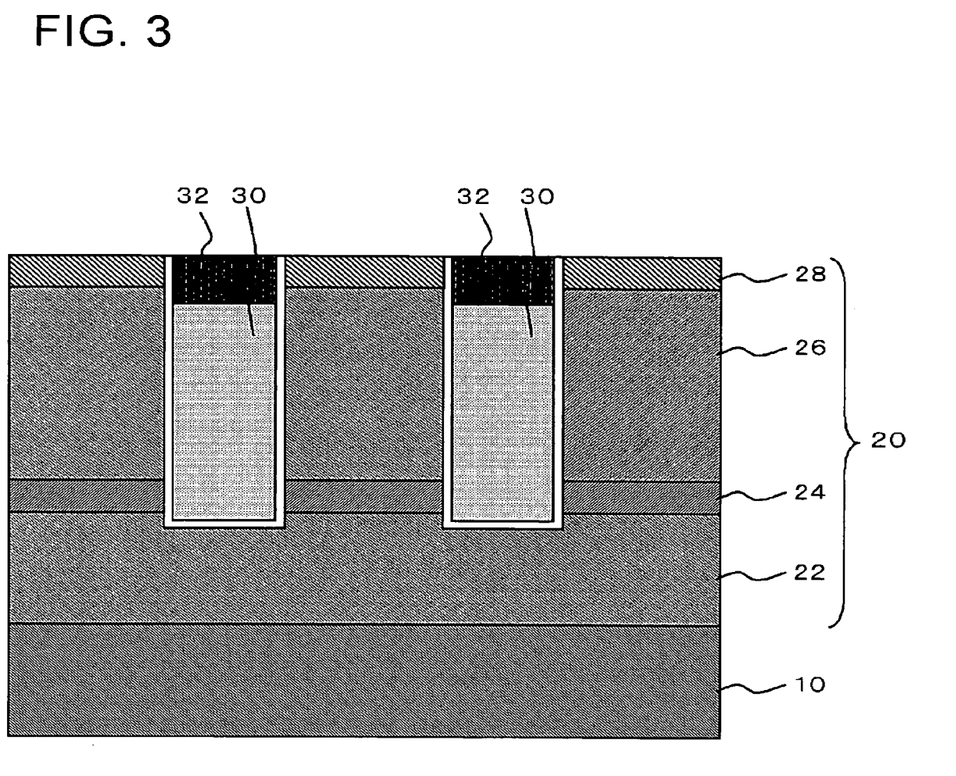
FIG. 3 is a schematic cross-sectional view for explaining the method of manufacturing the semiconductor device of FIG. 1.
Figure 4:
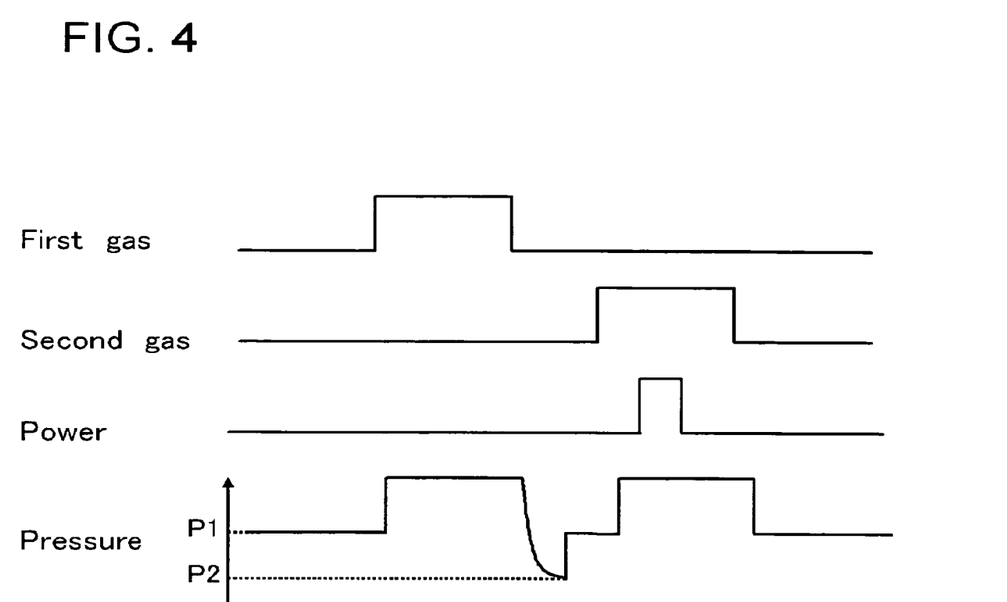
FIG. 4 is a timing chart for explaining the method of manufacturing the semiconductor device of FIG. 1.

Referring to FIGS. 2 to 4, a method of manufacturing the semiconductor device 1 will be described, as the first embodiment of the method of manufacturing according to the present invention. FIG. 4 is a timing chart for explaining the method of manufacturing the semiconductor device according to this embodiment. In FIG. 4, the lines denoted as "First gas" and "Second gas" respectively indicate the timing for introducing the first and the second gas, which will be subsequently described, into the vacuum chamber. The line denoted as "Power" indicates the timing to apply the power to generate the plasma, and the line of "Pressure" indicates the magnitude of the pressure inside the vacuum chamber.

To start with, the semiconductor substrate 10 with the conductive layer 30 exposed on the surface on one side (FIG. 2) is prepared, and is placed in a vacuum chamber not shown in the drawings (preparation step). The structure shown in FIG. 2 may be obtained by an etching process to form the recessed portion 20a in the insulating layer 20, and a Damascene process to fill the recessed portion 20a with a copper layer so as to constitute the conductive layer 30.

Then a processing gas predominantly composed of a silicon-containing compound (first gas) is introduced into the vacuum chamber, thus to expose the semiconductor substrate 10 in the chamber to the first gas atmosphere (silicon processing step). Examples of the first gas include monosilane ($SiH_4$), disilane ($Si_2H_6$) and dichlorosilane ($SiH_2Cl_2$). At this stage, the pressure inside the vacuum chamber may be set in a range of $5.2\times10^2$ to $6.5\times10^2$ Pa (4 to 5 Torr). Maintaining such condition for a predetermined duration of time leads to formation of the alloy layer 32 in the surface layer of the conductive layer 30 (FIG. 3).

Upon stopping the supply of the first gas, the vacuum chamber is depressurized (depressurizing step). In the depressurizing step, the pressure in the chamber is reduced to a pressure (P2: second pressure) lower than the pressure in the chamber at the time of starting the silicon processing step (P1: first pressure) (FIG. 4). At this stage, it is preferable to set the pressure P2 not to exceed 0.13 Pa (1 mTorr). Here, the pressure P1 may be around 13 Pa (0.1 Torr), for example. In this embodiment in particular, the depressurization is performed until the vacuum chamber reaches the saturation pressure. The pressure P2 in the chamber is maintained for a predetermined duration of time, for example 10 seconds.

Then a gas predominantly composed of a nitrogen-containing compound (second gas) is introduced into the vacuum chamber. Preferably, ammonia ($NH_3$) or nitrogen ($N_2$) may be employed as the second gas. At this stage, the pressure inside the vacuum chamber may be set in a range of $5.2\times10^2$ to $6.5\times10^2$ Pa (4 to 5 Torr). Also, an electric power is applied to the chamber under the presence of the second gas, so as to generate the plasma of the second gas. The semiconductor substrate 10 is then irradiated with the plasma thus generated (nitrogen plasma step). Such irradiation for a predetermined duration of time results in formation of the nitride layer 40 in the surface layer of the insulating layer 28, thereby completing the fabrication of the semiconductor device 1 shown in FIG. 1.

Figure 5:
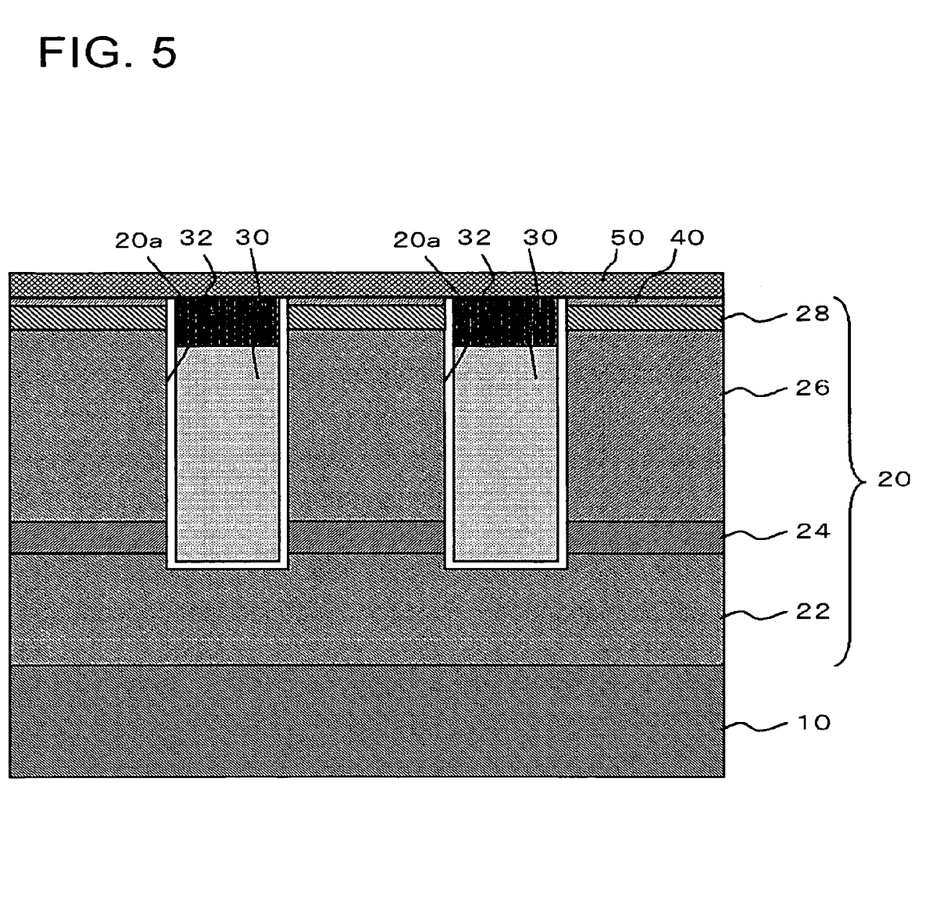
FIG. 5 is a schematic cross-sectional view showing a modification of the semiconductor device of FIG. 1.

Here, the nitrogen plasma step may be followed by a diffusion barrier formation step, which includes forming a diffusion barrier 50 (Ref. FIG. 5) so as to cover the surface of the semiconductor substrate 10 on which the conductive layer 30 is exposed. Preferable materials of the diffusion barrier include SiC, SiCN and SiOC.

The foregoing embodiment offers the following advantages. The manufacturing method according to this embodiment includes the depressurizing step, between the silicon processing step and the nitrogen plasma step. In the depressurizing step, the pressure in the vacuum chamber is reduced to the pressure P2 lower than the pressure P1 set at the time of starting the silicon processing step. This serves to reduce the amount of the silicon deposit that may remain on the surface of the insulating layer 20, created during the nitrogen plasma step after the depressurizing step. Accordingly, such manufacturing method provides the semiconductor device 1 that effectively restricts emergence of the leak current between the interconnects.

Also, since the method includes the silicon processing step and the nitrogen plasma step to be thereafter performed, the semiconductor device 1 thereby produced obtains excellent TDDB resistance and SIV resistance. To be more detailed, the alloy layer 32 formed during the silicon processing step serves to enhance the SIV resistance of the semiconductor device 1, while the nitride layer 40 formed during the nitrogen plasma step serves to improve the TDDB resistance of the semiconductor device 1. If, unlike the above, only the nitrogen plasma process is performed skipping the silicon processing, the semiconductor device 1 becomes more prone to incur the SIV. A probable reason is that the union of Cu and N provokes certain structural vulnerability. On the other hand, forming the alloy layer 32 in the surface layer of the conductive layer 30 in the silicon processing step prior to the nitrogen plasma process, as performed in the manufacturing method according to this embodiment, effectively suppresses the emergence of such vulnerability.

Further, the manufacturing method according to this embodiment permits nitriding the surface layer of the insulating layer 20 with a reduced amount of silicon deposit remaining on the surface of the insulating layer 20, which contributes in the formation of the nitride layer 40 in a uniform thickness. The uniformity in thickness of the nitride layer 40 is a preferable factor from the viewpoint of effectively preventing the semiconductor device 1 from incurring the TDDB. Thus, the foregoing embodiment provides a manufacturing method that grants the semiconductor device 1 with high reliability.

Figure 6:
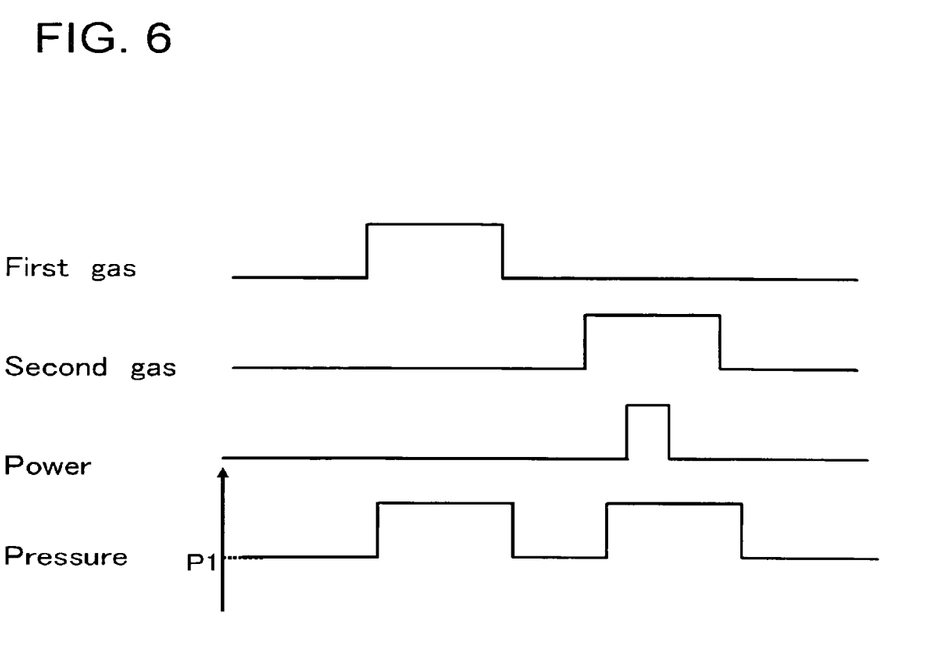
FIG. 6 is a timing chart for explaining a comparative example of the first embodiment.
Figure 7:
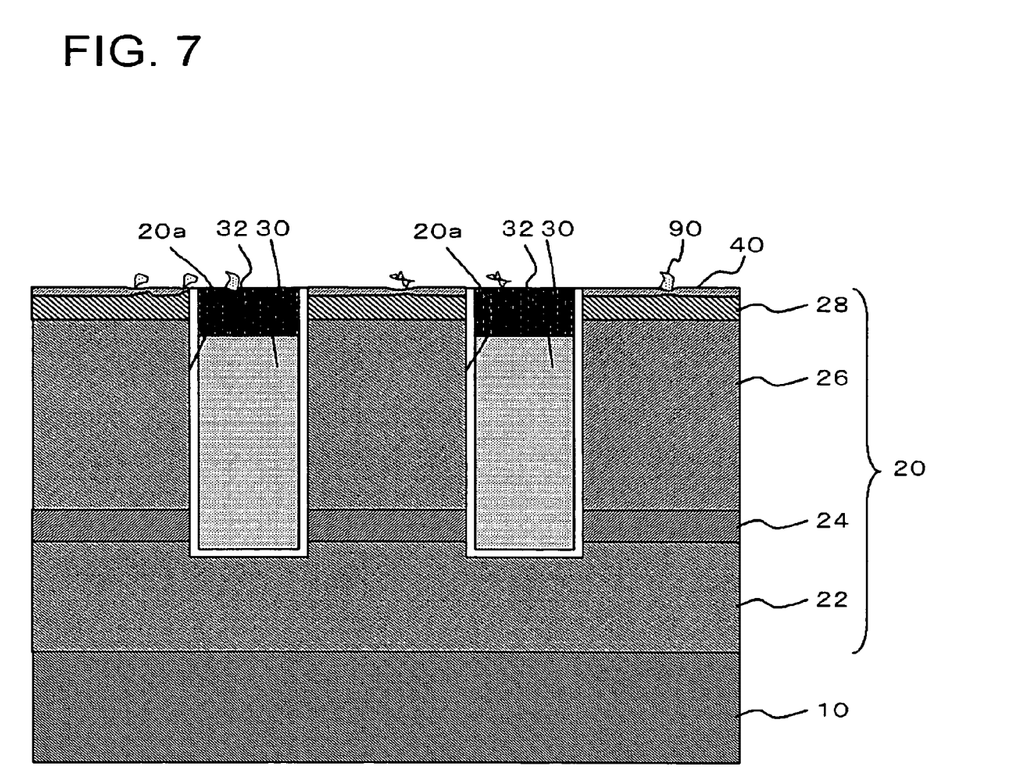
FIG. 7 is a schematic cross-sectional view for explaining the comparative example of the first embodiment.

In the case where the depressurizing step is not performed between the silicon processing step and the nitrogen plasma step unlike this embodiment, the leak current between the interconnects is increased. To be more detailed, if the pressure inside the chamber is not reduced to P2 after the silicon processing step as indicated by the timing chart of FIG. 6, the first gas remains in the chamber after the completion of the silicon processing step, and such residual gas reacts on the insulating layer 20 during the nitrogen plasma process. This results in creation of silicon deposit 90 (Si—Si compound), which remains on the insulating layer 20 as shown in FIG. 7. The silicon deposit 90 provokes an increase in leak current between the interconnects. Besides, the residual silicon deposit 90 on the surface of the insulating layer 20 disturbs the relevant region from being sufficiently irradiated with the nitrogen plasma, thereby degrading the uniformity in thickness of the nitride layer 40. On the other hand, the foregoing embodiment includes the depressurizing step of reducing the pressure inside the chamber to the level of P2, thus effectively suppressing the increase in leak current between the interconnects, and forming the nitride layer 40 with high uniformity in thickness.

Especially when the pressure P2 is set to be not higher than 0.13 Pa through the depressurizing step, the amount of silicon deposit can be reduced to substantially zero. This further enhances the reduction effect of the leak current between the interconnects. In this case, in addition, since the nitride layer 40 can be formed in a uniform thickness, the semiconductor device 1 acquires particularly high TDDB resistance.

When the diffusion barrier 50 (Ref. FIG. 5) is provided, the metal is prevented from diffusing from the surface of the insulating layer 20, and hence the reliability of the semiconductor device 1 is further upgraded. Especially when the diffusion barrier 50 is constituted of a low-k material such as SiC, SiCN or SiOC, the semiconductor device 1 gains better characteristics.

In this embodiment, the insulating layers 22, 26 are constituted of a porous film. Employing a low-k film such as the porous film allows suppressing parasitic capacitance between the conductive layers 30. Here, when the insulating layers 22, 26 are constituted of the low-k film, the electric field concentrates in the interface between the conductive layer 30 and the insulating layer 20, which makes the TDDB more likely to take place. Accordingly, in this case, employing the semiconductor device 1 having high TDDB resistance results particularly beneficial. It is to be noted, however, that employing the porous film for the insulating layers 22, 26 is not imperatively required.

Second Embodiment

Figure 8:
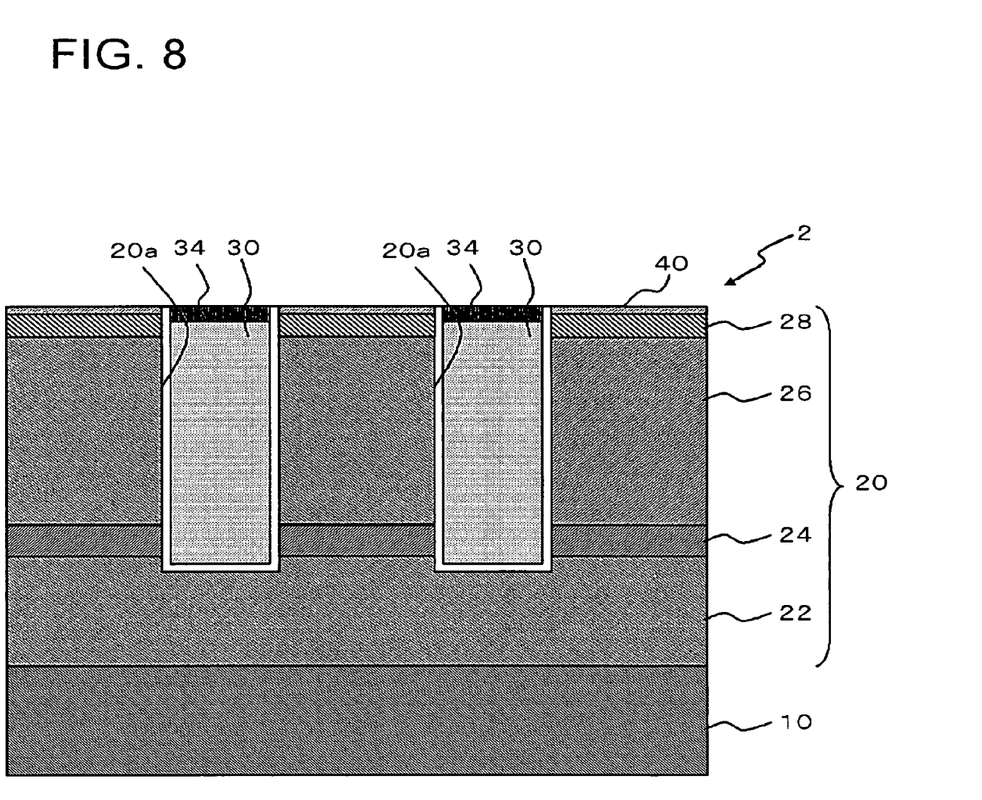
FIG. 8 is a schematic cross-sectional view showing a semiconductor device according to the second embodiment of the present invention.

FIG. 8 is a schematic cross-sectional view showing a semiconductor device according to the second embodiment of the present invention. The semiconductor device 2 includes a semiconductor substrate 10, an insulating layer 20, a conductive layer 30, an alloy layer 34, and a nitride layer 40. Out of these constituents, the semiconductor substrate 10, the insulating layer 20, the conductive layer 30 and the nitride layer 40 are similarly constituted to those shown in FIG. 1. In this embodiment, an alloy layer 34 composed of CuSiN is provided in the surface layer of the conductive layer 30.

Figure 9:
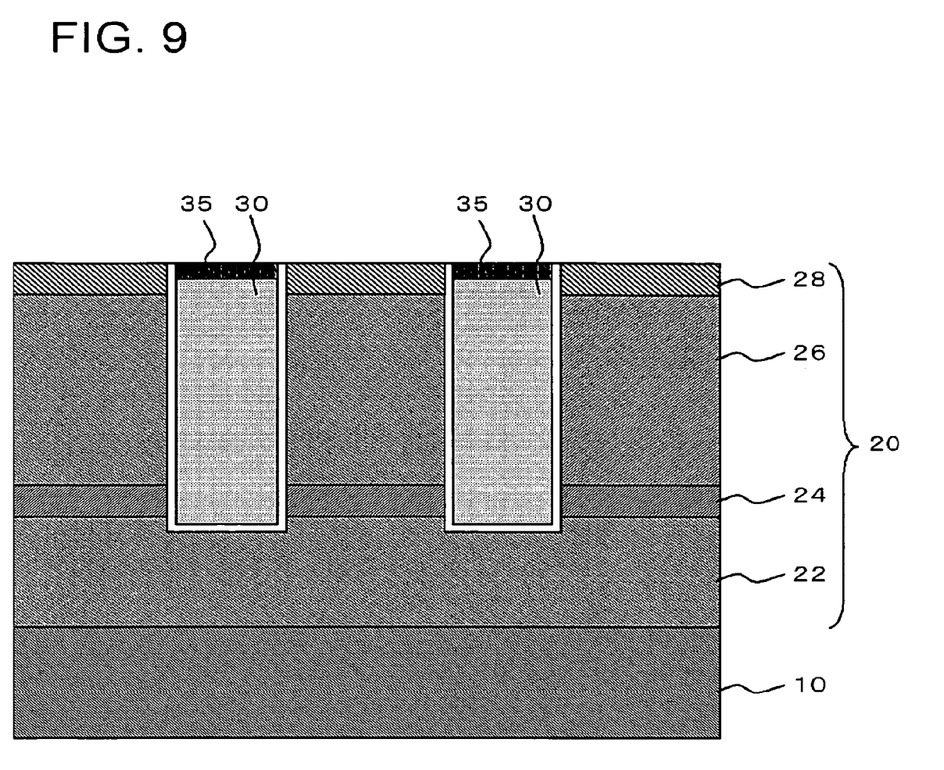
FIG. 9 is a schematic cross-sectional view for explaining the method of manufacturing the semiconductor device of FIG. 8.
Figure 10:
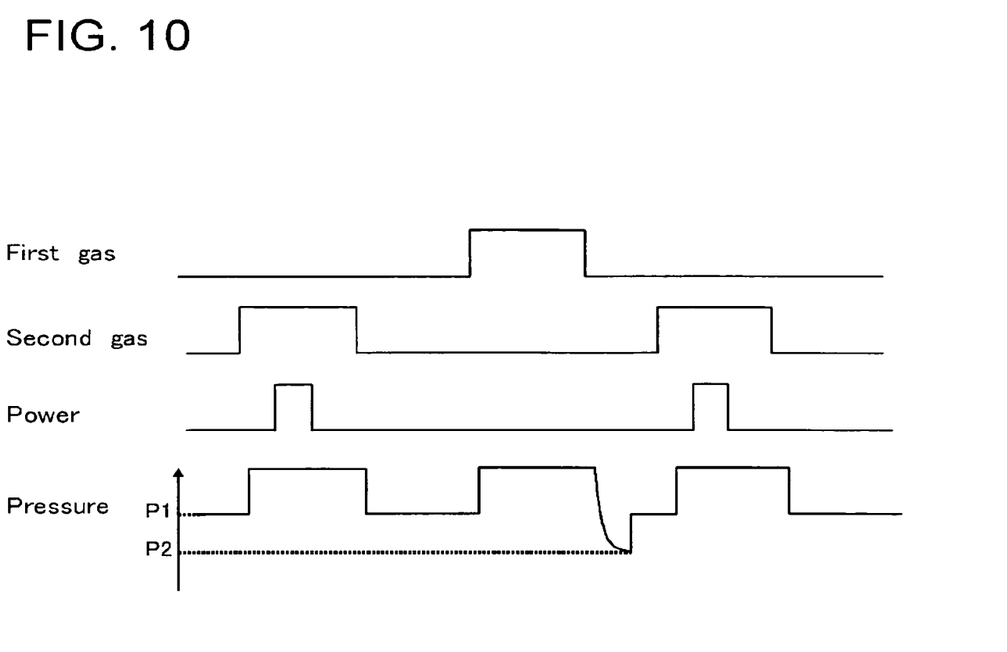
FIG. 10 is a timing chart for explaining the method of manufacturing the semiconductor device of FIG. 8.

Referring to FIGS. 9 and 10, a method of manufacturing the semiconductor device 2 will be described, as the second embodiment of the present invention. FIG. 10 is a timing chart for explaining the method of manufacturing according to this embodiment. In FIG. 10, the respective terms represent the same concept as those in FIG. 4.

To start with, the semiconductor substrate 10 with the conductive layer 30 exposed on the surface on one side (FIG. 2) is prepared, and is placed in a vacuum chamber not shown in the drawings (preparation step). Then a processing gas predominantly composed of a nitrogen-containing compound (second gas) is introduced into the vacuum chamber, followed by application of an electric power of a predetermined magnitude thus to generate the plasma of the second gas, with which the semiconductor substrate 10 is irradiated (preliminary step).

Thereafter, a processing gas predominantly composed of a silicon-containing compound (first gas) is introduced into the vacuum chamber, thus to expose the semiconductor substrate 10 in the chamber to the first gas atmosphere (silicon processing step). Maintaining such status for a predetermined duration of time leads to formation of copper silicide ($Cu_xSi$) 35 in the surface layer of the conductive layer 30 (FIG. 9).

Upon stopping the supply of the first gas, the vacuum chamber is depressurized to the pressure P2 (depressurizing step). Then the second gas is introduced into the vacuum chamber, and the semiconductor substrate 10 is irradiated with the second gas plasma (nitrogen plasma step). Continuing such irradiation for a predetermined duration of time results in formation of the alloy layer 34 in the surface layer of the conductive layer 30, as well as the nitride layer 40 in the surface layer of the insulating layer 28, thereby completing the fabrication of the semiconductor device 2 shown in FIG. 8.

The foregoing embodiment offers the following advantages. The manufacturing method according to this embodiment also includes the depressurizing step, between the silicon processing step and the nitrogen plasma step. The depressurizing step contributes in reducing the amount of the silicon deposit that may remain on the surface of the insulating layer 20, created during the nitrogen plasma step after the depressurizing step. Accordingly, such manufacturing method provides the semiconductor device 2 that effectively restricts emergence of the leak current between the interconnects. Also, since the method includes the silicon processing step and the nitrogen plasma step to be thereafter performed, the semiconductor device 2 thereby produced obtains excellent TDDB resistance and SIV resistance. Further, the manufacturing method according to this embodiment permits nitriding the surface layer of the insulating layer 20 with a reduced amount of silicon deposit remaining on the surface of the insulating layer 20, which contributes in the formation of the nitride layer 40 in a uniform thickness. Thus, the foregoing embodiment also provides a manufacturing method that grants the semiconductor device 2 with high reliability.

Figure 11:
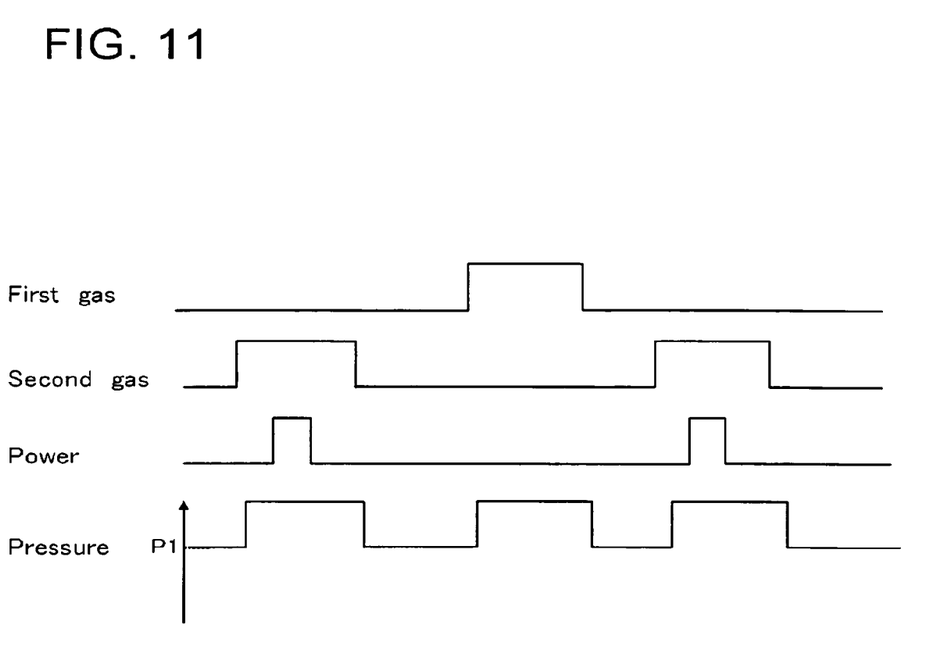
FIG. 11 is a timing chart for explaining a comparative example of the second embodiment.
Figure 12:
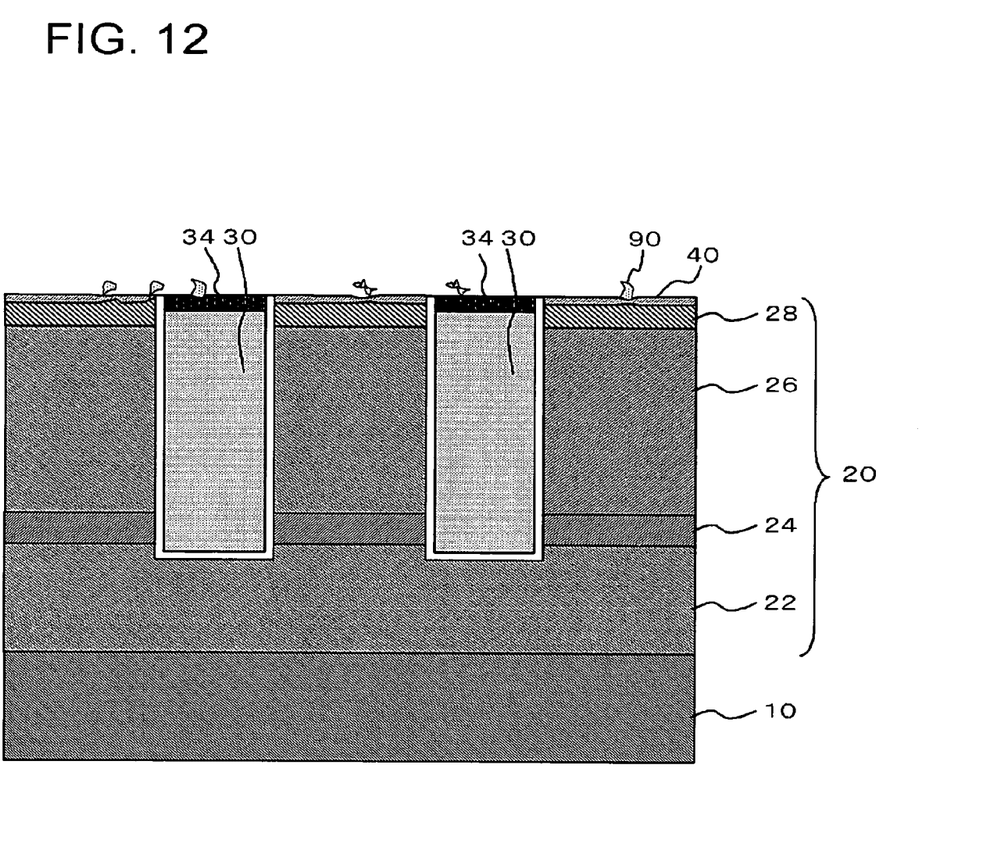
FIG. 12 is a schematic cross-sectional view for explaining the comparative example of the second embodiment.

If, unlike this embodiment, the depressurizing step is not performed between the silicon processing step and the nitrogen plasma step as indicated by the timing chart shown in FIG. 11, the silicon deposit 90 remains on the insulating layer 20 during the nitrogen plasma process (FIG. 12). This leads to an increase in leak current between the interconnects, and to degradation in uniformity in thickness of the nitride layer 40. On the other hand, the foregoing embodiment allows effectively suppressing the increase in leak current between the interconnects, and forming the nitride layer 40 with high uniformity in thickness.

This embodiment also includes the preliminary step. When the Damascene process is performed to form the conductive layer 30, copper oxide (CuO) may be produced in the surface layer of the conductive layer 30 upon executing a CMP process. Executing the preliminary step allows deoxidizing the copper oxide.

The semiconductor device and the method of manufacturing the same according to the present invention are not limited to the foregoing embodiments, but may be modified in various manners. For example, while an interconnect is exemplified as the conductive layer 30 in the embodiments, the conductive layer 30 may be a via plug.

It is apparent that the present invention is not limited to the above embodiment, and may be modified and changed without departing from the scope and spirit of the invention.

What is claimed is:

1. A semiconductor device comprising:
   a semiconductor substrate;
   an insulating layer provided on said semiconductor substrate;
   a conductive layer composed essentially of a copper-containing metal, filled in a recessed portion provided in said insulating layer;
   an alloy layer containing copper and silicon, formed in a surface layer of said conductive layer; and
   a nitride layer formed by nitriding said insulating layer, in a uniform thickness in a surface layer of said insulating layer, wherein nitrogen is unevenly distributed in the nitride layer.

2. The semiconductor device according to claim 1, wherein said insulating layer is a porous film.

3. The semiconductor device according to claim 1, wherein the insulating layer comprises at least one bilayer formed from an etch stop layer over a porous film.

4. The semiconductor device according to claim 1, wherein the insulating layer comprises:
   a first porous film on the substrate;
   a first etch stop layer on the first porous film;
   a second porous film on the first etch stop layer; and
   a second etch stop layer on the second porous film.

5. The semiconductor device according to claim 4, wherein the recessed portion contacts the first porous film, the first etch stop layer, the second porous film and the second etch stop layer.

6. The semiconductor device according to claim 4, wherein the conductive layer contacts the first porous film, the first etch stop layer and the second porous film.

7. The semiconductor device according to claim 4, wherein the alloy layer contacts the nitride layer, the second etch stop layer and the second porous film.

8. The semiconductor device according to claim 4, wherein the conductive layer contacts the first porous film, the first etch stop layer, the second porous film and the second etch stop layer.

9. The semiconductor device according to claim 4, wherein the alloy layer contacts the nitride layer and the second etch stop layer.

10. A semiconductor device comprising:
    a semiconductor substrate;
    an insulating layer provided on said semiconductor substrate, the insulating layer being formed from:
    a first porous film on the substrate,
    a first etch stop layer on the first porous film, a second porous film on the first etch stop layer, and
    a second etch stop layer on the second porous film;
    a conductive layer composed essentially of a copper-containing metal, filled in a recessed portion provided in said insulating layer;
    an alloy layer containing copper and silicon, formed in a surface layer of said conductive layer; and
    a nitride layer formed by nitriding said insulating layer, in a uniform thickness in a surface layer of said insulating layer, wherein nitrogen is unevenly distributed in the nitride layer 11. The semiconductor device according to claim 10, wherein the recessed portion contacts the first porous film, the first etch stop layer, the second porous film and the second etch stop layer.

12. The semiconductor device according to claim 10, wherein the conductive layer contacts the first porous film, the first etch stop layer and the second porous film.

13. The semiconductor device according to claim 10, wherein the alloy layer contacts the nitride layer, the second etch stop layer and the second porous film.

14. The semiconductor device according to claim 10, wherein the conductive layer contacts the first porous film, the first etch stop layer, the second porous film and the second etch stop layer.

15. The semiconductor device according to claim 10, wherein the alloy layer contacts the nitride layer and the second etch stop layer.

* * * * *